United States Patent [19]
Tanimoto

[11] Patent Number: 5,485,111
[45] Date of Patent: Jan. 16, 1996

[54] POWER ON RESET CIRCUIT WITH ACCURATE DETECTION AT LOW VOLTAGES

[75] Inventor: Susumu Tanimoto, Tokyo, Japan

[73] Assignee: NEC Corporation, Japan

[21] Appl. No.: 224,432

[22] Filed: Apr. 8, 1994

[30] Foreign Application Priority Data

Apr. 8, 1993 [JP] Japan ................................. 5-081577

[51] Int. Cl.⁶ .......................... H03K 17/22; H03K 5/153
[52] U.S. Cl. ........................... 327/143; 327/198; 327/545
[58] Field of Search .......................... 327/143, 142, 327/545, 546, 198, 539

[56] References Cited

U.S. PATENT DOCUMENTS

| | | | |
|---|---|---|---|
| 4,633,107 | 12/1986 | Norsworthy | 327/198 |
| 4,902,910 | 2/1990 | Hsieh | 327/198 |
| 5,109,163 | 4/1992 | Benhamida | 327/143 |
| 5,130,569 | 7/1992 | Glica | 327/143 |
| 5,144,159 | 9/1992 | Frisch et al. | 327/198 |

*Primary Examiner*—Timothy P. Callahan
*Assistant Examiner*—Terry Englund
*Attorney, Agent, or Firm*—Ostrolenk, Faber, Gerb & Soffen

[57] ABSTRACT

A supply-voltage detector having a low minimum operational voltage while having a large variation is combined with a supply-voltage detector having a high detection precision while having a high minimum operational voltage, so that the supply voltage is detected at a high accuracy without malfunctioning even on a low voltage. A system, such as a microcomputer, could then be reset when the detected supply voltage falls below a certain value. This combined circuit will improve the accuracy of detecting this supply voltage.

5 Claims, 12 Drawing Sheets

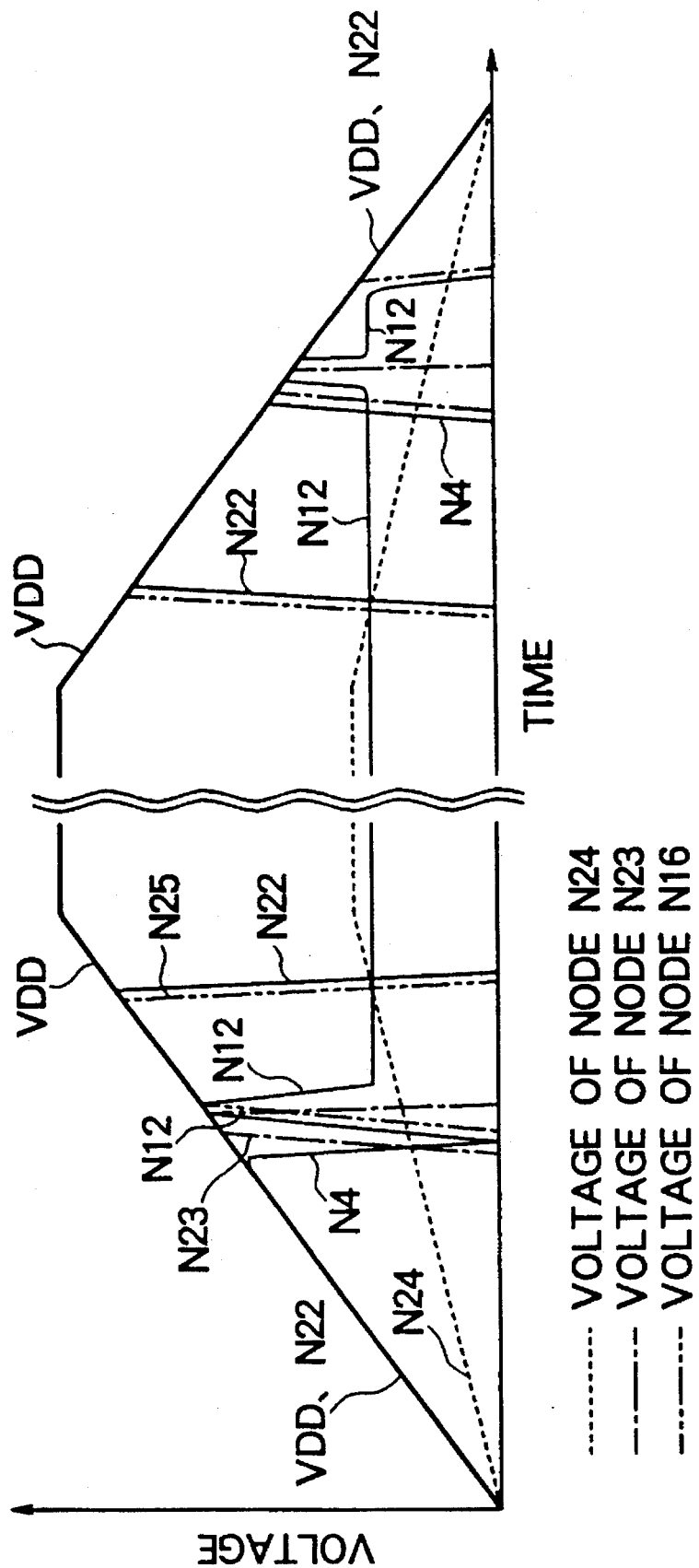

---------- VOLTAGE OF NODE N24
—·—·— VOLTAGE OF NODE N23
———— VOLTAGE OF NODE N16

·········· VOLTAGE OF NODE N24
—·—·— VOLTAGE OF NODE N23
———— VOLTAGE OF NODE N25

POWER ON RESET CIRCUIT WITH ACCURATE DETECTION AT LOW VOLTAGES

BACKGROUND OF THE INVENTION

1. Field of the Invention

The present invention relates to a power ON reset circuit, and, more particularly to a power ON reset circuit which is suitable for a reset power supply circuit of a microcomputer constituted of CMOS transistors.

2. Description of the Related Art

A microcomputer has many sequential circuits typified by flip-flops. The sequential circuit looses its one stable status once powered off, and will have a so-called unstable status of either a logical value of "0" or "1" when powered on next time. This is called "volatile." A RAM (Random Access Memory) is well known to show this feature most prominently.

For a microcomputer to execute a predetermined operation immediately after power on, the statuses of at least some sequential circuits should always be the same immediately upon power on. In a micro-coded microcomputer, for example, it is necessary to always access the address of the same micro ROM (Read Only Memory) immediately after power on.

To set the status of the sequential circuit, which should always be the same upon power on, immediately after power is given, is called "initialization" or "system reset." This system reset has conventionally been executed using a circuit which outputs a pulse of a given width upon power on. This circuit is called a "power ON reset circuit."

FIG. 1 is a circuit diagram showing an example of a conventional power ON reset circuit. A series circuit of a P channel MOS type FET (Field Effect Transistor) M1 and a resistor R1 is connected between a power supply of voltage VDD and ground, with the FET M1 connected to the power supply (VDD). The gate of the FET M1 is connected to a node N1 between the FET M1 and the resistor R1.

Also connected between the power supply (VDD) and ground is a series circuit of a resistor R2 and an NMOSFET M2, with the FET M2 connected to the ground. The gate of the FET M2 is connected to the node N1, with a capacitor C1 connected between the node N1 and the ground potential.

A series circuit of CMOSFETs M3 and M4 is connected between the power supply (VDD) and ground, with the FET M4 connected to the power supply (VDD). The gates of the FETs M3 and M4 are both connected to a node N2 between the resistor R2 and the FET M2. A capacitor C2 is connected between the supply voltage VDD and the node N2 (the gates of the FETs M3 and M4).

Connected to the subsequent stage of the CMOSFETs M3 and M4 are CMOSFETs M5 and M6 having the same structure as the FETs M3 and M4. The gates of the CMOSFETs M5 and M6 are connected to a node N3 between the FETs M3 and M4. The gates of the FETs M5 and M6 are connected via a capacitor C3 to the ground potential. A node N4 is where the FET M5 is connected to the FET M6.

The input terminals and output terminals of the CMOSFETs M3 and M4 are the node N2 and the node N3 respectively, while the input terminals and output terminals of CMOSFETs M5 and M6 are the node N3 and the node N4, respectively.

This circuit outputs a high pulse which is reset when the power supply voltage VDD rises to a predetermined potential from the ground (GND) potential. This function is accomplished by the capacitors C1 and C3 connected at one end to the GND and the capacitor C2 connected to the power supply of voltage VDD. When the power is given from the power supply (VDD), those capacitors C1, C3 and C2 are not charged so that the nodes N1, N2 and N3 are at the same potential levels as the power supply voltage VDD and GND. But, the output of the node N4 becomes a high level (potential nearly equal to the supply voltage VDD) first, after which the capacitors C1–C3 are charged in order and the potentials at the nodes N1, N2 and N3 become the potentials of the (VDD–|VTM1|), GND and VDD. As a result, the output of the node N4 becomes a low level (about the GND potential). VTM1 is the threshold voltage of the FET M1.

As the output of the node N4 becomes a low level, VDD–|VTM1| should be higher than the logical threshold voltage of an inverter comprising the FET M2 and the resistor R2.

It is apparent from the above that the circuit which merely outputs a reset pulse upon power on can be accomplished by a simple structure having PMOSFETs M7 and M9, an NMOSFET M8 and a capacitor C4 as shown in FIG. 2. In FIG. 2, the FET M7 and the capacitor C4 are connected in series between the power supply of voltage VDD and ground, while the PMOSFET M9 and NMOSFET M8 are connected in series therebetween. The gates of the FETs M9 and M8 are both connected to a node N5 where the FET M7 is connected to the capacitor C4, with the gate of the FET M7 grounded. A node N6 where the FET M9 is connected to the FET M8 is the output terminal of this circuit.

Referring to FIG. 2, as the capacitor C4 has not been charged immediately after power from the supply voltage VDD is given, the node N5 becomes a low level and the output of the node N6 becomes a high level. If the potential of the power supply voltage VDD is higher than the absolute value of the threshold voltage of the FET M7 thereafter, the FET M7 is turned on, causing the capacitor C4 to be charged up. As a result, the nodes N5 and N6 respectively become a high level and a low level.

The power ON reset circuit shown in FIG. 1 has an advantage over the circuit shown in FIG. 2 in that the former circuit also has the function of a voltage detector. Even if the VDD potential falls after the supply voltage VDD rises once and the output of the node N5 becomes a low level in the circuit in FIG. 2, the node N6 stays low and there is no way to know that the VDD potential has dropped.

According to the circuit in FIG. 1, from a viewpoint of DC current, when the potential of the power supply voltage VDD becomes higher than |VTM1|+VTM2 (VTM2: threshold voltage of the FET M2), the output of the node N4 becomes a low level while when the VDD potential becomes lower than |VTM1|+VTM2, the output of the node N4 becomes a high level, thus making it possible to detect whether the power supply voltage VDD is higher or lower than |VTM1|+VTM2. This is because that as the gate and drain of the FET M1 are short-circuited, the potential at the node N1 becomes VDD–|VTM1| and the potential at the node N2 changes from a high level to a low level when VDD–|VTM2| becomes higher than the logical threshold voltage of the inverter which comprises the FET M2 and the resistor R2. That is, the potential at the node N4 is a low level when the value of A expressed by the following relationship is positive: A=VDD–|VTM1|–(the logical threshold value of the inverter having the FET M2 and resistor R2). Conversely, the potential at the note N4 is a high level when the value of A is negative.

As the load of the inverter comprising the FET M2 and the resistor R2 has a constant resistance R2, the logical threshold value of this inverter is around the threshold voltage of the FET M2 whose current varies greatly. Accordingly, when VDD−|VTM1|−VTM2=VDD−(|VTM1|+ VTM2) is positive, the output of the node N4 in the power ON reset circuit in FIG. 1 becomes a low level, while the former potential is negative, the output of the node N4 becomes a high level, so that the positive or negative difference between VDD and |VTM1|+VTM2 will be detected. It is of course possible to adjust the detection voltage by the resistances of the resistors R1 and R2 and (gate width)/(gate length) of the FETs M1 and M2.

In general, a power ON reset circuit which, like the one shown in FIG. 1, can also detect the DC supply voltage is incorporated in the microcomputer that is used in battery-driven devices, such as portable devices. This power ON reset circuit allows the microcomputer to inform a user of a low battery or stops the microcomputer before it crashes due to the battery voltage dropping below the proper operational voltage range.

Due to the recent widening application of microcomputers to various types of portable devices, fast operation of microcomputers is often demanded in battery-driven devices. The operational voltage range therefore becomes narrower, demanding for a power ON reset circuit which can detect the supply voltage more accurately.

Since the detection voltage of the conventional power ON reset circuit in FIG. 1 depends on (VTM1+VTM2), this circuit has a large manufacturing variation and is temperature dependent. As the threshold voltage of MOSFETs normally has a manufacturing variation of ±0.1 to ±0.2 V and a temperature dependency of around −2 mV/° C., (VTM1+ VTM2) has a temperature variation of ±0.2 to ±0.4 V normally, and about ±0.2 V with the operational temperature range set to ±50° C. The difference between the maximum and minimum values of the detection voltage therefore becomes 0.8 to 1.2 V.

A band-gap reference voltage generator is well known as having a high voltage precision. FIGS. 3 and 4 illustrate two typical examples of the conventional band-gap reference voltage generator which uses MOSFETs. The anode area is determined so that the saturated currents IS1, IS2 and IS3 of PN junction diodes D1, D2 and D3 have a relation of IS1= IS3>IS2. The ratio of the resistance of a resistor R3 to that of a resistor R4 is set to a predetermined value according to the output voltage. For easier explanation, it is assumed below that ratio R4/R3=n (n: positive integer).

In the circuit in FIG. 3, a diode D1, a resistor R3 and CMOSFETs M10 and M11 are connected in series, a diode D2, and CMOSFETs M12 and M13 are connected in series, with the gates of the FETs M11 and M13 connected together and the gates of the FETs M10 and M12 connected together, and a diode D3, a resistor R4 and PMOSFET M14 are connected in series, with the gate of the FET M14 connected to the gates of the FETs M11 and M13. The VDD side end of the resistor R3 is a node N10, the anode of the diode D2 is a node N11, and the VDD side end of the resistor R4 is a node N12 which is the output terminal of this circuit.

The circuit in FIG. 4 has a comparator 7 which has the node N10 as a positive (+) input 8 and the node N11 as a negative (−) input 9 and has its output coupled to the gate of the FET M14. This circuit does not have the FETs M10 and M12 of the circuit shown in FIG. 3. Except for those points, the circuit in FIG. 4 is the same as the circuit in FIG. 3. Therefore, the same reference numerals as used in FIG. 3 are also used in FIG. 4 to denote the identical or corresponding components, and their detailed explanation will not be repeated.

The PMOSFETs M11, M13 and M14 have the same ratio of (gate width)/(gate length) and NMOSFETs M10 and M12 also have the same (gate width)/(gate length).

The operations of those circuits will now be discussed. In FIGS. 3 and 4, the constant current flows through the FETs M11, M13 and M14, and the current value is determined so that the potentials at the nodes N10 and N11 become equal to each other. When the same current flows through the FETs M10 and M12, their gate-source voltages should be the same, because the FETs M10 and M12 have the same (gate width)/(gate length) ratio. With the gates of the FETs M10 and M12 short-circuited, therefore, the potentials at the nodes N10 and N11 where the sources of those transistors are connected become equal to each other. In FIG. 4, the potentials at the nodes N10 and N11 are compared with the comparator 7 and are so controlled as to be equal to each other. Thus, the following equation is derived.

$$I \times R3 + VT \times ln(I/IS1) = VT \times ln(I/IS2)$$

where I is the current flowing through the FETs M11, M13 and M14 and VT=kT/q (k: Boltzmann's constant, T: absolute temperature and q: unit charge). Thus, I is given by the following equation (1).

$$I = VT \times ln(IS1/IS2) \times 1/R3 \quad (1)$$

The output voltages of the nodes N12 and N13 both become the voltage across the resistor R4, which is given by the following equation (2), plus the forward voltage across the diode D3.

$$R4 \times VT \times ln(IS1/IS2) \times 1/R3 = n \times VT \times ln(IS1/IS2) \quad (2)$$

The equation (2) is determined by the resistance ratio n, the ratio of the anode area of the diode D1 to that of the diode D2, and the absolute temperature T. Generally speaking, the area ratio of the resistors, the PN junction, and etc. is obtained at high precision by the MOS processing technology, so that the output voltage given by the equation (2) becomes a constant value very accurately at a constant temperature.

As the absolute value of the forward voltage of diodes normally has a slight variation of less than about ±20 mV at a constant temperature, the output voltages at the nodes N12 and N13 are approximately constant at the same temperature and are about 1.1 to 1.2 V at the normal temperature.

While the voltage across the resistor R4 has a positive temperature dependency with respect to the absolute temperature T as apparent from the equation (2), the forward voltage of diodes has a negative temperature dependency. The temperature characteristic can therefore become considerably small by properly selecting n in the equation (2).

FIG. 5 shows a circuit which uses a circuit 14 similar to the one shown in FIG. 3 or FIG. 4, in addition to a comparator 16 and resistors R5 and R6. This circuit can accurately detect the power supply voltage of an arbitrary value by selecting the proper resistances for the resistors R5 and R6. Thus, the circuit in FIG. 5 is expected to be adapted for a power ON reset circuit. The circuit in FIG. 5 however has two critical shortcomings as a power ON reset circuit.

First, the circuits shown in FIGS. 3 and 4 do not properly function by simply activating the power supply (VDD) because the state of no current flowing through the FETs M11 and M13 before power on will be satisfied in those circuits even after the power supply (VDD) is activated. The requirements for the circuits in FIGS. 3 and 4 are such that the same current should flow through both the FETs M11, M13 and M14, and also through the FETs M10 and M12, and that the potentials at the nodes N10 and N11 should be equal to each other. The state of no current flowing through the FETs M11 and M13 fulfills the requirements.

As a solution to this problem, a capacitor C5 is connected to a node N14 in the circuit in FIG. 3, and a capacitor C6 is connected to a node N15 in the circuit in FIG. 4, as shown in FIGS. 6 and 7, respectively. With this modification, upon power on, the PMOSFETs M11 and M13 are always turned on to permit a current to flow therethrough, and the modified circuits will properly start functioning. This modification, however, has the following shortcoming. Given that VGSM11 represents the potential difference between the gate and source of each of the FETs M11 and M13 under the proper operation, when VDD drops abruptly by |VGSM11|−max(|VTM1|, |VTM3|), the FETs M11 and M13 are turned off and the current flowing through those FETs M11 and M13 becomes 0 (max (a, b) representing a larger one of a and b). Even if the supply voltage VDD is above the designed detection voltage, the modified circuits still have the same power-on problem as the circuit without the capacitor C5 or C6 has.

The second critical shortcoming is that the modified circuits would malfunction when the supply voltage falls down to or below a certain level. To provide the expected output voltage, all the MOSFETs in the circuit in FIG. 3, the FETs M10 to M14, should operate in the saturated area. In view of the series connection of the diode D2 and FETs M12 and M13, this requires a supply voltage equal to or above $$0.1\ V + VTM12 + VFD2 \tag{3}$$

where VTM12 is the threshold voltage of the FET M12 which is normally about 0.7 V, VFD2 is the forward voltage of the diode D2, normally about 0.5 to 0.7 V, and the first term, 0.1 V, is the minimum voltage necessary to saturate the FET M13.

The voltage expressed by the equation (3) is therefore normally 0.3 to 1.5 V below which the output of the node N12 rapidly drops, setting a low level in the circuit in FIG. 3 as in the case where the supply voltage is sufficiently high. When the supply voltage becomes below the operational voltage of the comparator 7, the circuit in FIG. 4 naturally malfunctions. Normally, the minimum operational voltage of a comparator designed by the CMOS processing technology to function on a low voltage is about 1.5 to 1.8 V. The power ON reset circuit shown in FIG. 1 does not have the above-described two problems inherent to the circuit in FIG. 5 which is designed based on the circuit in FIG. 3 or FIG. 4. In this respect, the power ON reset circuit in FIG. 1 having a large variation in detection voltage has conventionally been used in a microcomputer.

While the conventional power ON reset circuit in FIG. 1 surely outputs a reset pulse upon power on, it has a large variation in DC detection voltage, so that the voltage allowable by the entire microcomputer-based system should be the minimum operational voltage of microcomputers plus a voltage variation of the power ON reset circuit. In other words, while this conventional circuit can control the crashing of microcomputers, it inevitably requires an increased minimum operational voltage.

SUMMARY OF THE INVENTION

It is therefore an object of the present invention to provide a power ON reset circuit which will detect a supply voltage at a high precision and allows the minimum operational voltage of a microcomputer to be designed lower.

A power ON reset circuit according to one aspect of the present invention has a voltage detector, which has a low minimum operational voltage and surely outputs a pulse upon power on though having a large variation in detection voltage, in combination with a band-gap reference voltage generator, which uses the output pulse of the detector to have an improved power-on operation and has an additional capacitor to properly function even if there is a sharp change in supply voltage. This power ON reset circuit can therefore accomplish a power ON reset function as well as a function of detecting the supply voltage at a high accuracy.

BRIEF DESCRIPTION OF THE DRAWINGS

FIGS. 13A and 13B are timing charts for explaining the operation of the first embodiment;

DETAILED DESCRIPTION OF THE PREFERRED EMBODIMENTS

Figure 8:
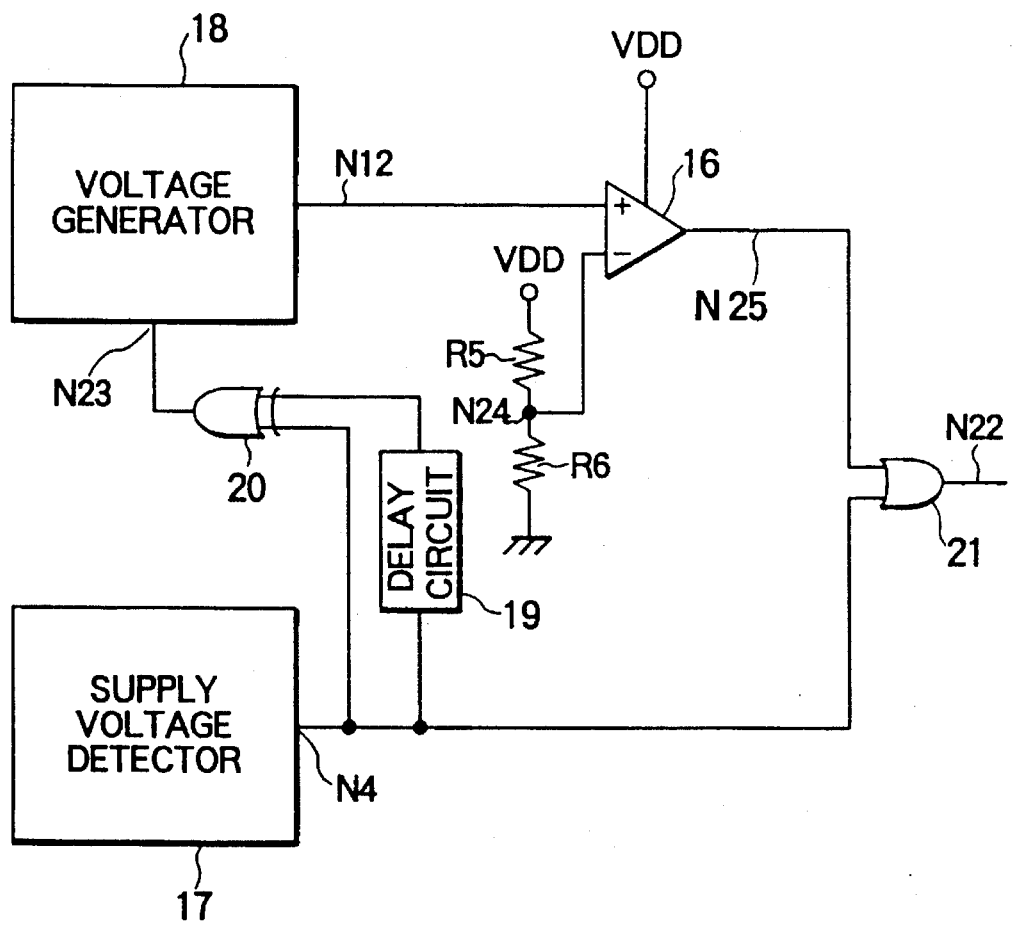
FIG. 8 is a block diagram showing a power ON reset circuit according to a first embodiment of the present invention.

FIG. 8 presents a block diagram showing a power ON reset circuit according to a first embodiment of the present invention. Referring to FIG. 8, the power ON reset circuit of this embodiment comprises a supply-voltage detector 17, which has an excellent characteristic at the time of power on at which a variation in detection voltage is normally large and has a wide operational voltage, i.e., the above-described circuit in FIG. 1, and a band-gap reference voltage generator 18 with an improved supply-voltage variation characteristic, i.e., the circuit in FIG. 9 or the circuit in FIG. 10. This power ON reset circuit further comprises an exclusive OR (EXOR) gate 20, which has one input connected directly to an output node N4 of the detector 17 and another input connected via a delay circuit 19 to this node N4 and has its output connected to an input node N23 of the voltage generator 18, a comparator 16, which receives the voltage of a power supply VDD divided by resistors R5 and R6 as a negative (−) input and the output from a node N12 of the voltage generator 18 as a positive (+) input, and an OR gate 21, which receives the output (node N25) of the comparator 16 and the output node N4 of the detector 17 as its inputs and provides an output from a node N22.

Figure 6:
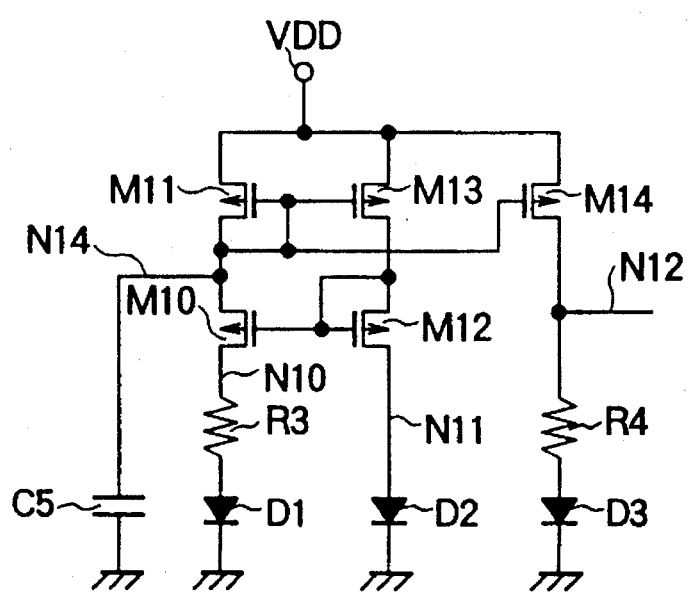
FIG. 6 is a circuit diagram of an improved modification of the circuit in FIG. 3.
Figure 9:
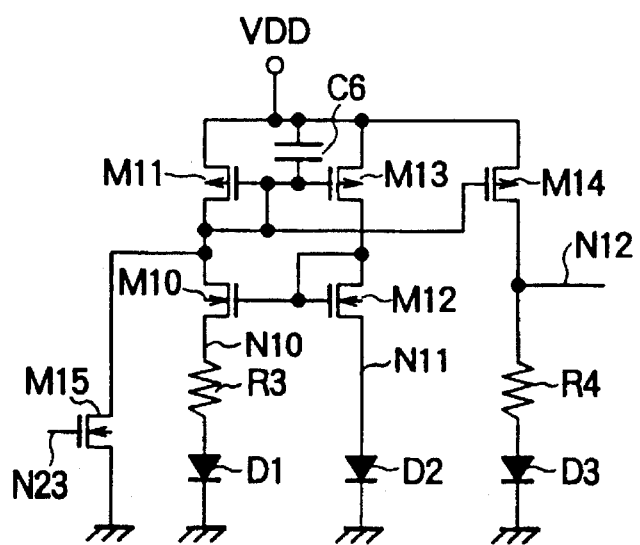
FIG. 9 is a circuit diagram of a first example of a voltage generator shown in FIG. 8.

FIG. 9 illustrates a first specific example of the circuit structure of the voltage generator 18 shown in FIG. 8. This generator 18 has an NMOSFET M15, which has the input from the node N23 as a gate input, and a capacitor C6 connected between the gates of the FETs M11 and M13 and the power supply VDD. Since this circuit is the same as the one shown in FIG. 6 except for the NMOSFET M15 and capacitor C6, the same reference numerals as used in FIG. 6 will also be used in FIG. 9 to denote the corresponding or identical components and their description will not be repeated below.

Figure 7:
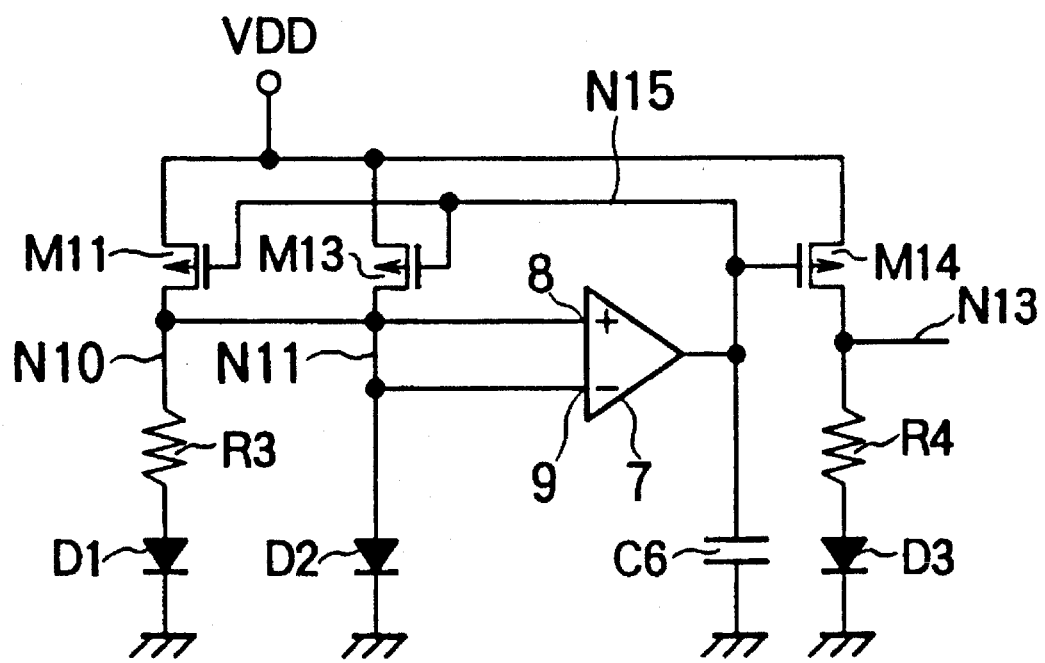
FIG. 7 is a circuit diagram of an improved modification of the circuit in FIG. 4.
Figure 10:
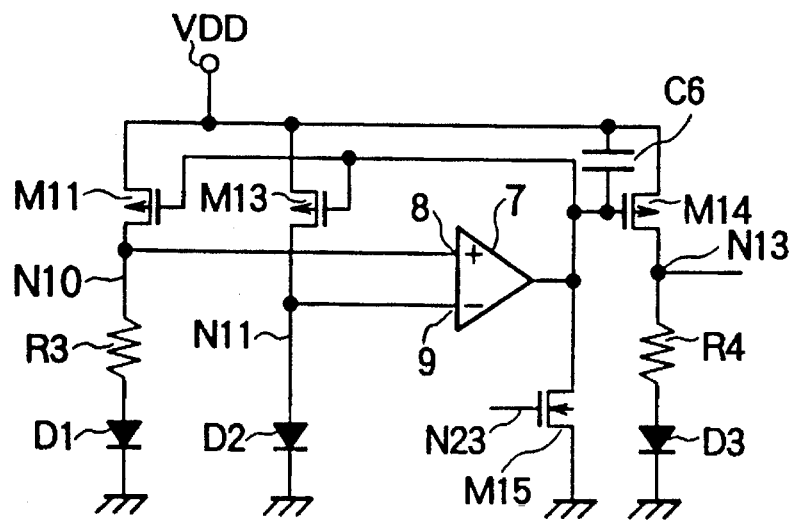
FIG. 10 is a circuit diagram of a second example of the voltage generator shown in FIG. 8.

FIG. 10 illustrates a second specific example of the circuit structure of the voltage generator 18 shown in FIG. 8. This generator 18 has an NMOSFET M15, which is connected between the output of the comparator 7 and the ground potential and has the input node N23 as its gate input, and a capacitor C6 connected between the output of the comparator 7 and the power supply VDD. Since this circuit is the same as the one shown in FIG. 7 except for those FET M15 and capacitor C6, the same reference numerals as used in FIG. 7 will also be used in FIG. 10 to denote the corresponding or identical components and their description will not be repeated below.

As mentioned above, the power ON reset circuit according to this embodiment has the voltage detector 17, which surely outputs a pulse upon power on, the pulse generating circuit which produces a pulse with a predetermined width when the potential status of the output node N4 changes from a low level to a high level or vice versa, and the voltage generator 18, which has the output of the pulse generating circuit as its one input and has a small manufacturing variation and a small temperature dependency. While having a large manufacturing variation and large temperature dependency, the voltage detector 17 can detect the DC supply voltage and will not malfunction even when the supply voltage is around 0 V. Further, the detection voltage of the voltage detector 17 is always higher than the minimum operational voltage of the voltage generator 18.

Figure 1:
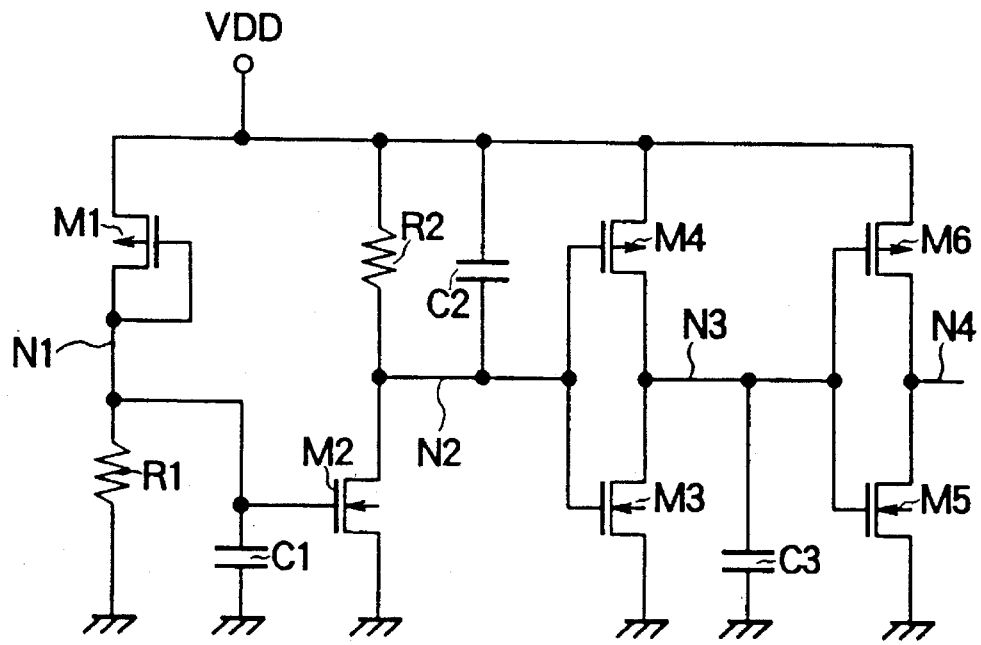
FIG. 1 is a circuit diagram showing one example of a conventional power ON reset circuit.

The voltage detector 17 is the power ON reset circuit shown in FIG. 1, which is used in a microcomputer, and thus has the following three major characteristics as mentioned earlier.

(1) It always outputs a reset pulse upon power on.

(2) It operates even on a voltage of around 0 V.

(3) It functions as a DC supply-voltage detector whose detection voltage has a large manufacturing variation and large temperature dependency.

The voltage generator 18 is an improved band-gap voltage generator of this invention, whose specific structure is illustrated in FIG. 9 or FIG. 10 and which has the following four major characteristics.

(1) It will not operate upon power on.

(2) It malfunctions when the supply voltage becomes lower than about 1.3 to 1.8 V.

(3) When the supply voltage drastically changes, the circuit keeps malfunctioning thereafter.

(4) The voltage detecting accuracy under the normal operation has a small manufacturing variation and shows a small temperature dependency.

The combination of the circuit 17 and the circuit 18 as in this embodiment will overcome the aforementioned shortcoming (3) of the circuit 17 and the aforementioned shortcomings (1), (2) and (3) of the circuit 18, and will only have the merits (1) and (2) of the circuit 17 and the merit (4) of the circuit 18.

The reason for the above will now be discussed.

Figure 11:
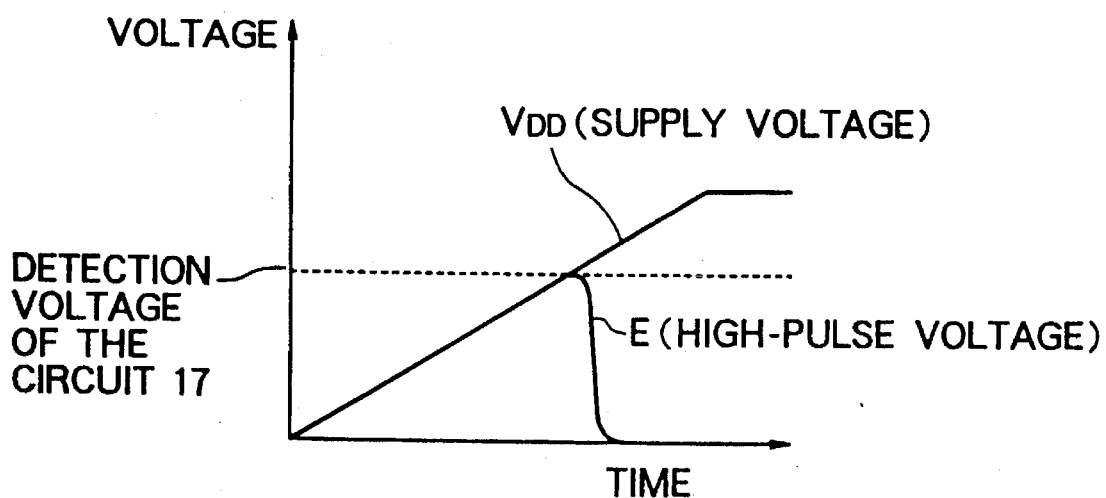
FIG. 11 is a waveform diagram showing a first example of the operation of the circuit in FIG. 8.
Figure 12:
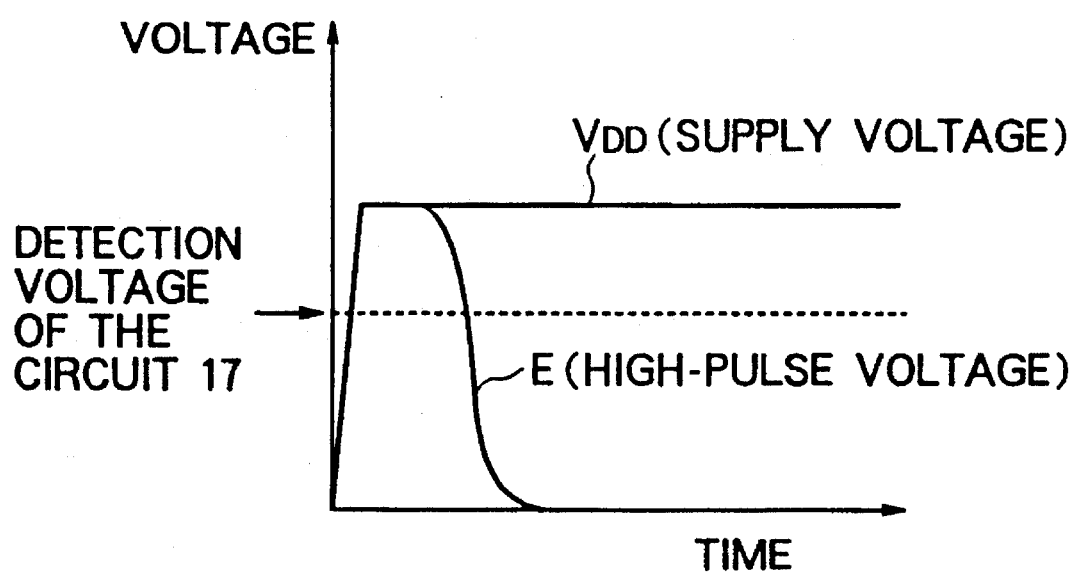
FIG. 12 is a waveform diagram showing a second example of the operation of the circuit in FIG. 8.

When the supply voltage VDD is given, the circuit 17 which is used as a power ON reset circuit for a microcomputer outputs a high-pulse voltage E whose peak voltage is nearly equal to the detection voltage (broken line) of the circuit 17 as shown in FIG. 11 when the supply voltage VDD rises slowly and outputs a high-pulse voltage E whose peak voltage is equal to the supply voltage VDD after rising as shown in FIG. 12 when the supply voltage VDD rises sharply.

When the potential at the node N4 of the circuit 17 changes to a low level from a high level at this time, the EXOR 20, whose inputs are the output from the node N4 and the output of the delay circuit 19 connected to the node N4, outputs a high pulse having a width equivalent to the amount of delay of the delay circuit 19 at the falling edge. This pulse becomes the input (node N23) of the band-gap reference voltage generator 18 and is input to the gate of the NMOSFET M15 in FIG. 9 or FIG. 10.

Figure 2:
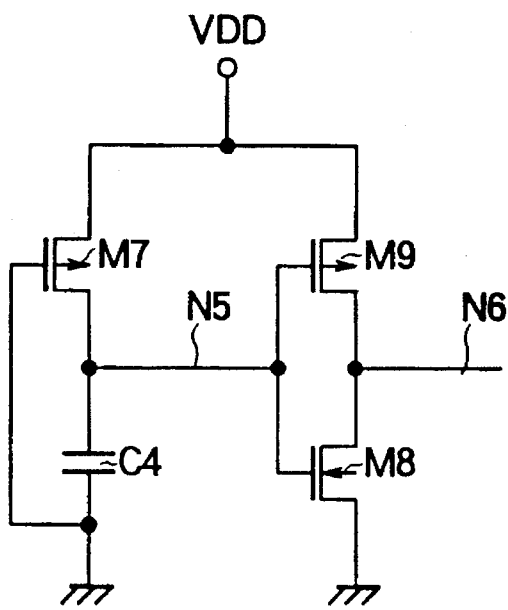
FIG. 2 is a circuit diagram showing another example of the conventional power ON reset circuit.

Upon power on, therefore, the gates of the PMOSFETs M11, M13 and M14 of the voltage generator 18 are temporarily short-circuited, so that a current flow through the series circuit including the FETs M11 and M13 at the initial stage, allowing the power ON reset circuit to start functioning properly. The drawback (1) of the circuits shown in FIGS. 1 and 2 is therefore overcome.

While the output of the EXOR gate 20 is at a high level, a through current flows through the FETs M11 and M15, but this current is a pulse current which hardly increases the average current consumption.

Figure 3:
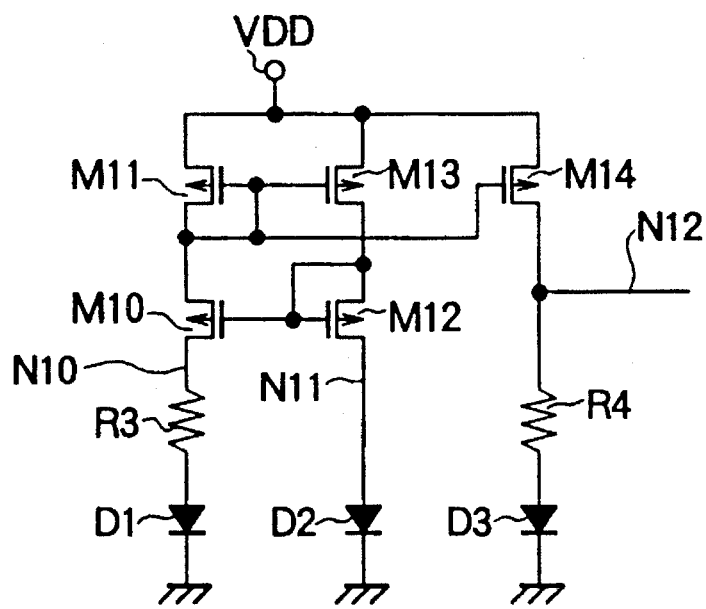
FIG. 3 is a circuit diagram showing one example of a conventional band-gap reference voltage generator.
Figure 4:
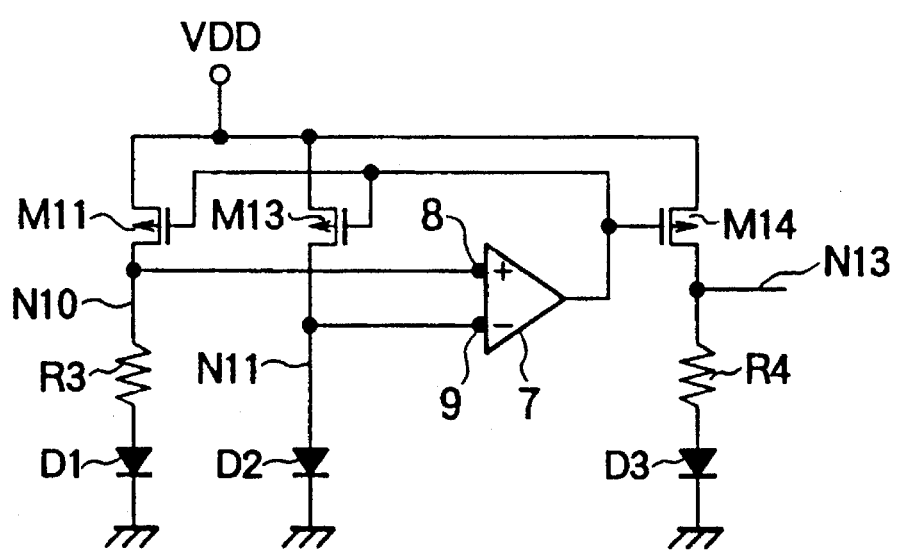
FIG. 4 is a circuit diagram showing another example of the conventional band-gap reference voltage generator.
Figure 5:
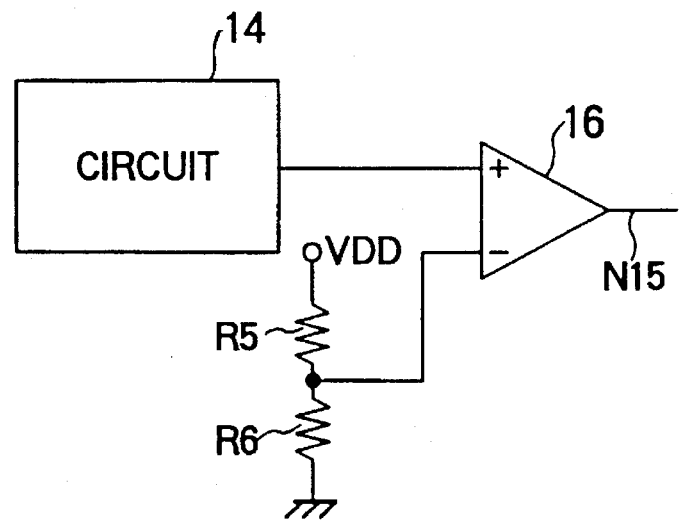
FIG. 5 is a circuit diagram showing an example of the application of the circuit in FIG. 3 or FIG. 4.

Further, even though the NMOSFET M15 is added, the circuits shown in FIGS. 9 and 10 do not have a lower detection precision than the conventional band-gap reference voltage generators shown in FIGS. 3 and 4.

After the circuit 18 starts the normal function and the output of the node N12 becomes stable, the comparator 16 compares the voltage obtained by dividing the supply voltage VDD by the resistors R5 and R6, with the output voltage of the circuit 18 at the node N12. The output of the comparator 16 becomes a low level when the supply voltage VDD is higher than the voltage expressed by the following equation (4) and becomes a high level when VDD is lower than that voltage, thus accomplishing the function to detect whether the supply voltage VDD is higher or lower than the voltage given by the equation (4).

$$(R5+R6) \times (\text{output voltage of circuit } 18) \times 1/R6 \qquad (4)$$

Since the voltage having a small manufacturing variation and a small temperature dependency is multiplied by the resistance ratio in the equation (4), the voltage given by this equation also has a small manufacturing variation and a small temperature dependency, so that the precision of detecting the supply voltage VDD is considerably high.

The outputs of the circuit 17 and the comparator 16 are input to the OR gate 21. When one of the inputs has a high level, the output (node N22) of the power ON reset circuit of this embodiment becomes a high level, invoking the system reset. When one of the inputs has a low level, on the other hand, the microcomputer is permitted to function.

The reason why the output at the node N22 is given by the OR operation of the outputs of the circuit 17 and comparator 16 is that when the supply voltage falls below the minimum operational voltage of the circuit 18, the lower limit of the detection voltage of the circuit 17 is set to slightly higher than this minimum operational voltage of the circuit 18 to thereby overcome the shortcoming (2) of the conventional band-gap reference voltage generator.

In addition, since the capacitor C6 is connected between the gates of the FETs M11 and M13 and the power supply VDD in FIGS. 9 and 10, which show specific circuits examples of this embodiment, the gate-source voltages of the FETs M11 and M13 are kept constant even if there is a sharp variation in supply voltage. Accordingly, the shortcoming (3) of the conventional circuits in FIGS. 3 and 4 is overcome. In short, even when the supply voltage is about 1.3 to 1.5 V upon power on or when the supply voltage VDD suddenly changes, the power ON reset circuit of this embodiment always has a detection precision that is achieved by the precision of the output voltage of the band-gap reference voltage generator 18 multiplied by a resistance ratio.

Figure 13B:
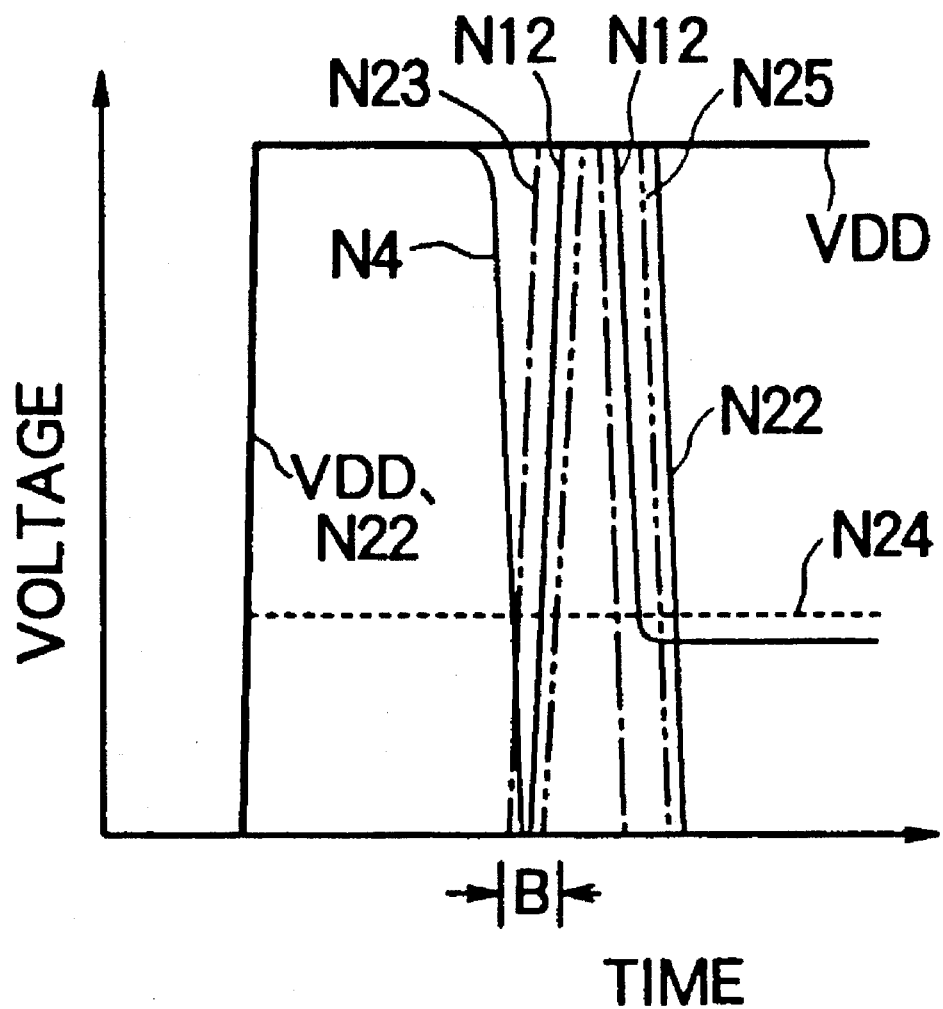

FIGS. 13A and 13B are timing charts for the individual signals of the power ON reset circuit shown in FIG. 8. Those diagrams show the voltage at a node N24 at which the supply voltage VDD is divided by the resistors R5 and R6 and the voltage at the output node N25 of the comparator 16 in addition to the supply voltage VDD and the voltages at the nodes N12, N22 and N23. FIG. 13A shows the case where the supply voltage VDD rises or falls slowly, and FIG. 13B shows the case where the supply voltage VDD rises sharply. The supply voltage VDD will not fall suddenly.

Figure 14:
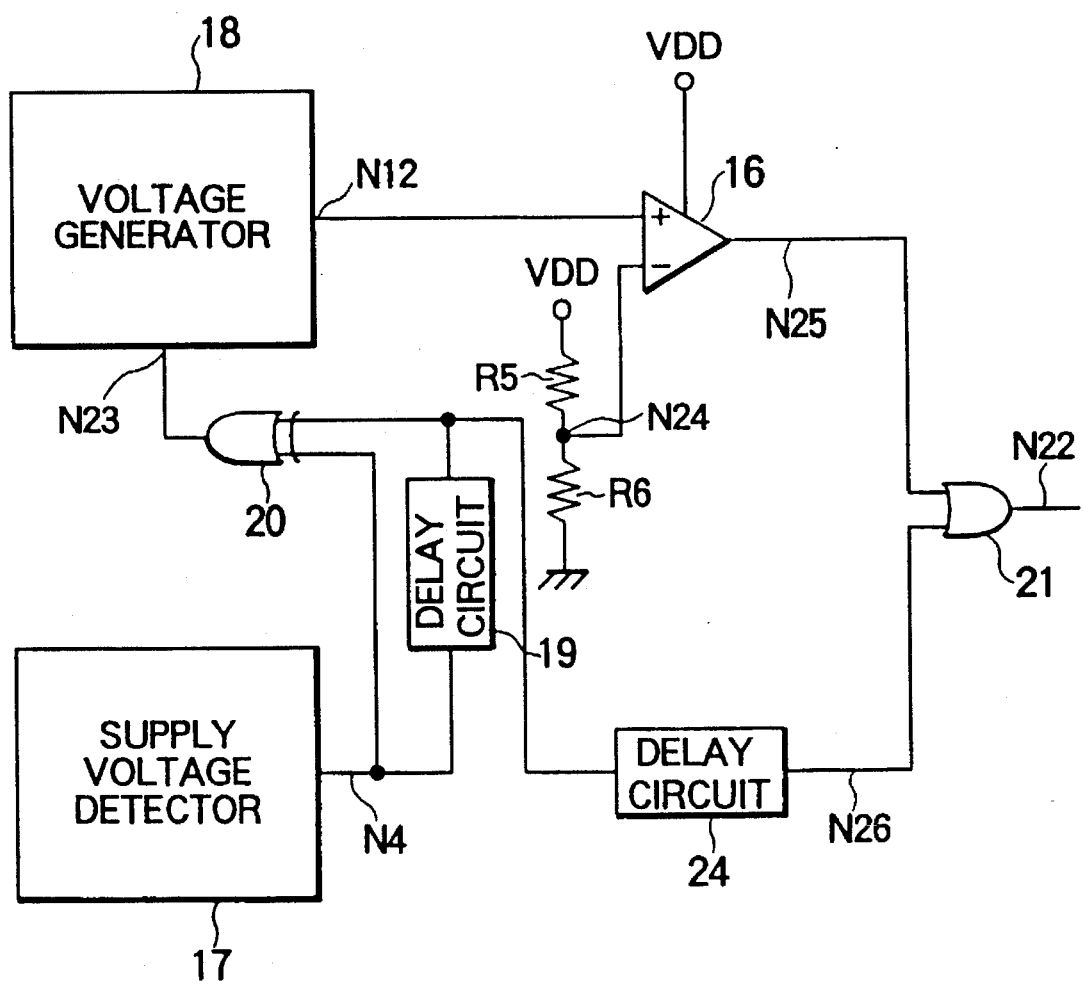
FIG. 14 is a circuit diagram showing a second embodiment of the present invention.

Referring to FIG. 14, a power ON reset circuit according to a second embodiment of the present invention will be described. This embodiment differs from the first embodiment only in that the output of the voltage detector 17 (node N4) is supplied to one input of the OR gate 21 through the delay circuit 19 and another delay circuit 24 at the subsequent stage. Since the other parts are the same as those of the circuit shown in FIG. 8, the same reference numerals as used in FIG. 8 will also be used in FIG. 14 to denote the corresponding or identical components and their description will not be repeated below.

In the second embodiment, the output (node N4) of the circuit 17 is connected to one input of the OR gate 21 via two stages of delay circuits 19 and 24, not directly, thereby providing a large delay from the output (node N4) of the detector 17 to the input (node N26) of the OR gate 21. Before the circuit 18 starts functioning, therefore, the input (node N26) of the gate 21 connected to the circuit 17 becomes a low level, thus preventing the reset state from being canceled.

Figure 15A:
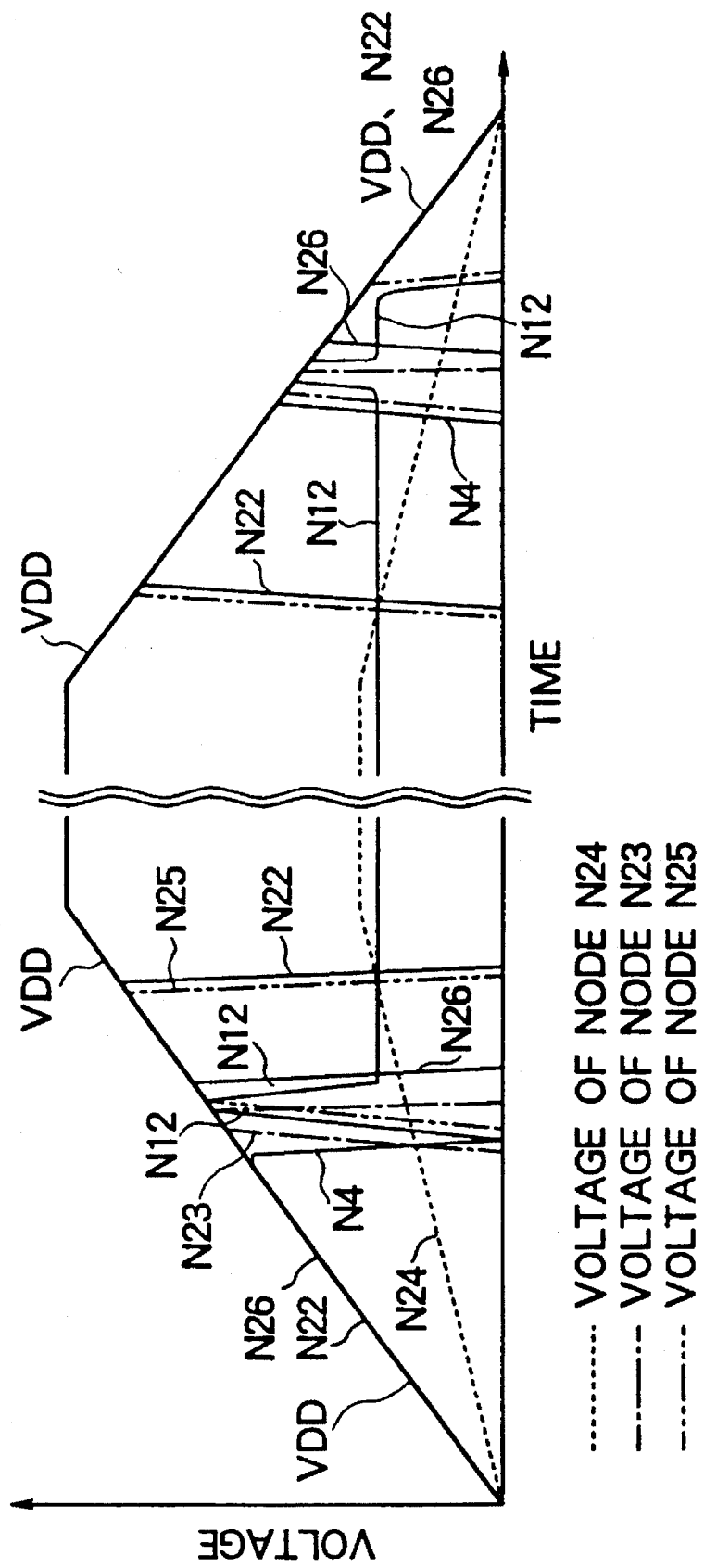
FIGS. 15A and 15B are timing charts for explaining the operation of the second embodiment.
Figure 15B:
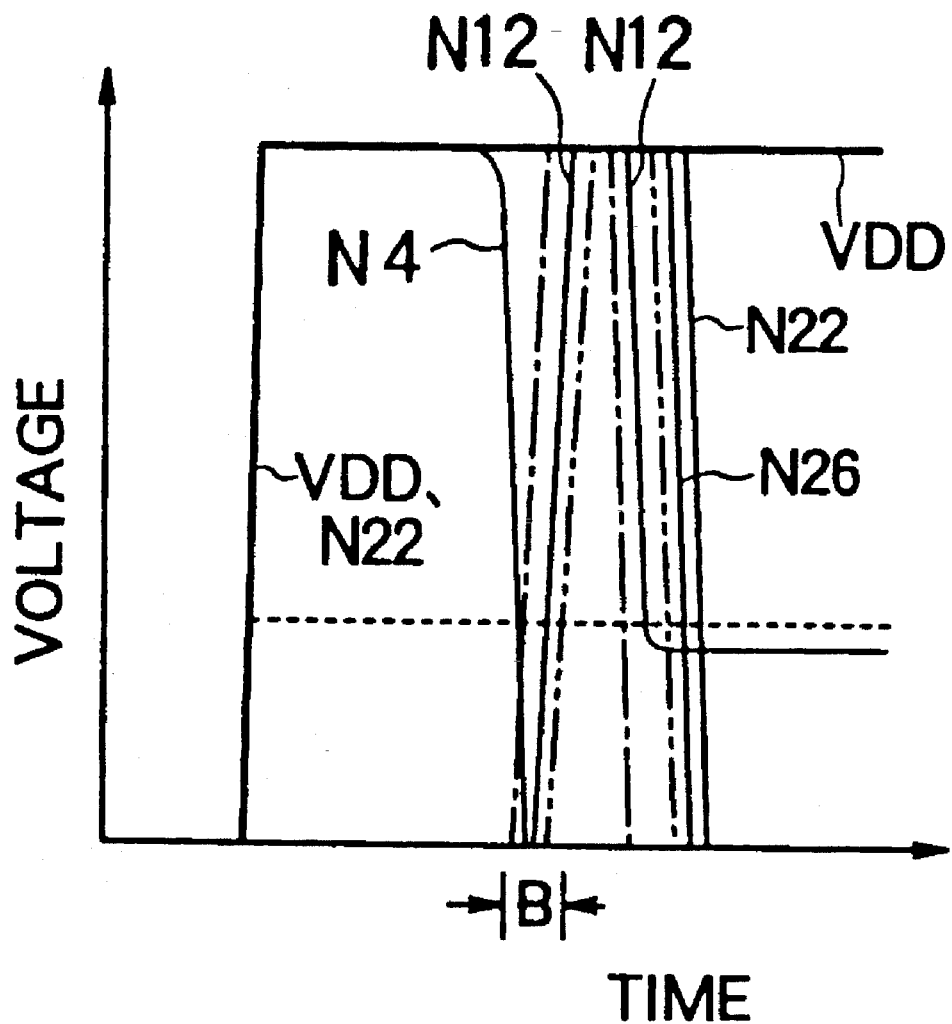

FIGS. 15A and 15B are timing charts for the individual signals of the power ON reset circuit according to the second embodiment. Those diagrams show the voltage at a node N26 of the delay circuit 24 in addition to those signals shown in FIGS. 13A and 13B. FIG. 15A shows the case where the supply voltage VDD rises or falls slowly, and FIG. 15B shows the case where the supply voltage VDD rises sharply. Likewise, the supply voltage VDD will not fall suddenly. During a period T in FIG. 13A, the voltage at the node N4 and the voltage at the output node N25 of the comparator 16 are both at a low level, so that the circuit may malfunction during this period T. In FIG. 15A, the voltage at the node N4 and the voltage at the output node N25 of the comparator 16 will not become a low level at the same time, so that the circuit will not malfunction during that period.

What is claimed is:

1. A power ON reset circuit comprising:

a first supply-voltage detector for outputting a predetermined pulse signal upon power on;

means for outputting a given pulse signal only when a logical level of said predetermined pulse signal changes;

a second supply-voltage detector for outputting a reference signal when triggered by said given pulse signal, a minimum operational voltage of said first supply-voltage detector, which is the minimum supply voltage at which said first supply-voltage detection is operable, being set lower than the minimum operational voltage of said second supply-voltage detector, which is the minimum supply voltage at which said second supply-voltage detector is operable, a detection voltage of said first supply-voltage detector being set higher than said minimum operational voltage of said second supply-voltage detector; and means responsive to said predetermined pulse signal and said reference signal for outputting the signal from said power ON reset circuit.

2. A power ON reset circuit comprising:

a first supply-voltage detector for outputting a predetermined pulse signal upon power on;

means for outputting a given pulse signal only when a logical level of said predetermined pulse signal changes;

a second supply-voltage detector for outputting a reference signal when triggered by said given pulse signal, a minimum operational voltage of said first supply-voltage detector, which is the minimum supply voltage at which said first supply-voltage detection is operable, being set lower than the minimum operational voltage of said second supply-voltage detector, which is the minimum supply voltage at which said second supply-voltage detector is operable, a detection voltage of said first supply-voltage detector being set higher than said minimum operational voltage of said second supply-voltage detector; and an OR gate having an output of said reference signal from said second supply-voltage detector and said predetermined pulse signal from said first supply-voltage detector as inputs, an output of said OR gate being an output signal of said power ON reset circuit.

3. A power ON reset circuit comprising:

a first supply-voltage detector for outputting a predetermined pulse signal upon power on;

means for outputting a given pulse signal only when a logical level of said predetermined pulse signal changes;

a second supply-voltage detector for outputting a reference signal when triggered by said given pulse signal, a minimum operational voltage of said first supply-voltage detector, which is the minimum supply voltage at which said first supply-voltage detection is operable, being set lower than the minimum operational voltage of said second supply-voltage detector, which is the minimum supply voltage at which said second supply-voltage detector is operable, a detection voltage of said first supply-voltage detector being set higher than said minimum operational voltage of said second supply-voltage detector;

said means for outputting a given pulse signal comprises a first delay circuit for delaying the output of said first supply-voltage detector; and an EXOR gate having outputs of said first supply-voltage detector and said delay circuit as inputs, an output of said EXOR gate being input to said second supply-voltage detector as said given pulse signal.

4. The power ON reset circuit according to claim 2 further comprising;
 a first delay circuit for delaying the output of said first supply-voltage detector; and
 a second delay circuit for delaying an output of said first delay circuit, an output of said second delay circuit being input to said OR gate as the output of said first supply-voltage detector.

5. The power ON reset circuit according to claim 2, wherein said second supply-voltage detector has a reference voltage generator, a voltage divider which outputs a voltage of a power supply divided by voltage dividing resistors and a comparator having an output of said reference voltage generator and the voltage from the voltage divider as inputs, said comparator supplying said reference signal from said second supply-voltage detector.

* * * * *